United States Patent
Bhalla et al.

(10) Patent No.: US 8,119,482 B2
(45) Date of Patent: Feb. 21, 2012

(54) MOSFET USING GATE WORK FUNCTION ENGINEERING FOR SWITCHING APPLICATIONS

(75) Inventors: Anup Bhalla, Santa Clara, CA (US); Sik K. Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/928,987

(22) Filed: Dec. 23, 2010

(65) Prior Publication Data

US 2011/0097885 A1 Apr. 28, 2011

Related U.S. Application Data

(60) Division of application No. 11/999,167, filed on Mar. 22, 2008, now Pat. No. 7,863,675, which is a continuation of application No. 11/146,499, filed on Jun. 6, 2005, now abandoned.

(51) Int. Cl.
*H01L 21/336* (2006.01)
(52) U.S. Cl. ............... 438/259; 257/330; 257/E29.257
(58) Field of Classification Search .................. None
See application file for complete search history.

(56) References Cited

U.S. PATENT DOCUMENTS

| | | | | |
|---|---|---|---|---|
| 5,082,795 | A * | 1/1992 | Temple | 438/138 |
| 5,571,741 | A * | 11/1996 | Leedy | 438/27 |
| 5,592,005 | A * | 1/1997 | Floyd et al. | 257/331 |
| 5,859,457 | A * | 1/1999 | Thiel et al. | 257/335 |
| 2002/0056874 | A1* | 5/2002 | Ohtake et al. | 257/336 |
| 2005/0098804 | A1* | 5/2005 | Furukawa et al. | 257/288 |
| 2005/0148178 | A1* | 7/2005 | Alsmeier et al. | 438/689 |
| 2006/0205133 | A1* | 9/2006 | Trivedi et al. | 438/199 |
| 2008/0315266 | A1* | 12/2008 | Eshun et al. | 257/285 |

* cited by examiner

*Primary Examiner* — Wael Fahmy
*Assistant Examiner* — Sarah Salerno
(74) *Attorney, Agent, or Firm* — Bo-In Lin

(57) ABSTRACT

This invention discloses a new MOSFET device. The MOSFET device has an improved operation characteristic achieved by manufacturing a MOSFET with a higher gate work function by implementing a P-doped gate in an N-MOSFET device. The P-type gate increases the threshold voltage and shifts the C-Vds characteristics. The reduced Cgd thus achieves the purpose of suppressing the shoot through and resolve the difficulties discussed above. Unlike the conventional techniques, the reduction of the capacitance Cgd is achieved without requiring complicated fabrication processes and control of the recess electrode.

12 Claims, 10 Drawing Sheets

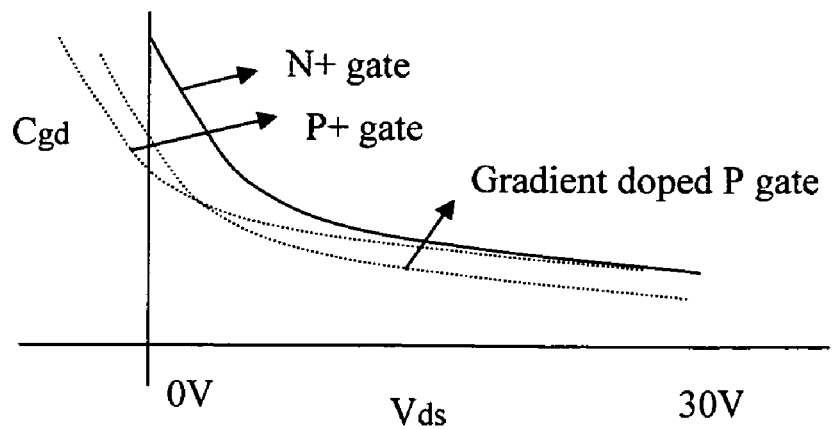
Fig. 8B
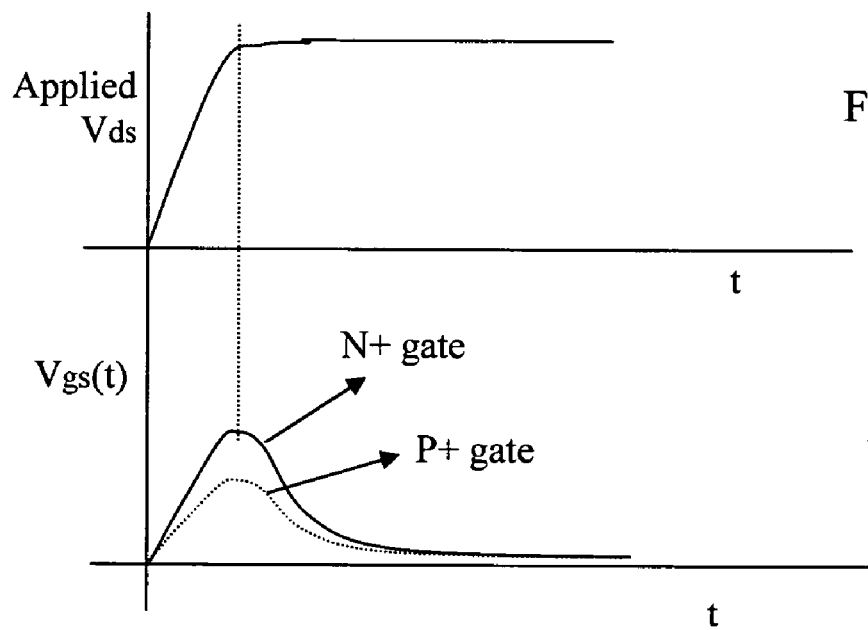
Fig. 8C
Fig. 8D

MOSFET USING GATE WORK FUNCTION ENGINEERING FOR SWITCHING APPLICATIONS

This is a Divisional Application of a previously filed application Ser. No. 11/999,167 filed on Mar. 22, 2008 now U.S. Pat. No. 7,863,675 and application Ser. No. 11/999,167 is a Continuous Application of Ser. No. 11/146,499 filed on Jun. 6, 2005 now abandoned by identical common inventors of this Application. The disclosures made by application Ser. Nos. 11/146,499 and 11/999,167 are hereby incorporated by reference in this Patent Application.

BACKGROUND OF THE INVENTION

1. Field of the Invention

The invention disclosed herein relates generally to the circuit configuration and packaging configuration of power MOSFETs. More particularly, this invention relates to a novel device for preventing shoot through problem by adjusting the work function of the MOS gate.

2. Description of the Prior Art

Conventional power MOSFET devices still face the shoot through problems that result in excessive dissipation and efficiency loss. Referring to FIG. 1 for a circuit diagram of a conventional buck converter 10 that includes a high side MOSFET 15 and a low side MOSFET 20 serially connected between an input terminal 25 having an input voltage represented by Vin and a ground terminal 30. The drain of the low side MOSFET 20 is connected to the source of the high side MOSFET 15 at a mid point 35 connecting to the load 40 through inductance L and capacitance C. When the buck converter 10 operates at high speed, a shoot through condition becomes a problem when both the high side and low side MOSFET are turned on at the same time causing a shoot through current to flow between the input terminal 25 and the ground terminal 30. The shoot through condition results in excessive dissipation and efficiency loss. In order to avoid the shoot through problem, a controlling circuit 45 is implemented to control the gate signals to generate a dead time between the gate signals for the high side and low side MOSFET. FIG. 2 shows such a dead time between the time when the high side MOSFET 15 is turned off and the time when the low side MOSFET 20 is turned on such that the high side and low side MOSFETs are prevented from turning on simultaneously.

However, the shoot through problem cannot be completely avoided due to the fact that a large drain current is generated at the low side MOSFET 20 when the high side MOSFET 15 is turned on as shown in FIG. 3 due to a large rate of change of the voltage, i.e., dV/dt, at the mid-connection point 35. FIG. 4A shows an equivalent circuit of the buck converter wherein the drain current generated flows through the gate-drain capacitor Cgd and then to the ground through the internal gate-source capacitor Cgs or through an equivalent circuit segment comprises gate resistor Rg inductor Lg, and external gate drive resistance Rext. Under such circumstances, if the impedance from the gate to the ground is not below a certain value then the drain current, i.e., Cdg*dV/dt, will generate a voltage drop across the gate of the low side MOSFET that would be large enough to turn on the low side MOSFET 20 thus inducing shoot-through.

In a full bridge application such as shown in FIG. 4B, a DC power supply Vin drives an inductive load L. In one half-cycle, both Q1 and Q4 are on and both Q2 and Q3 are off, the current flows through Q1 to the load L and through Q4 to the ground. In the next half-cycle both Q2 and Q3 are switched on and Q1 and Q4 are off, the current flows through Q2 to the load L and through Q3 to the ground. At the moment Q2 is turned on Q4 must be completed off. However, large rate of change of the voltage over Q2 when Q2 is turned on may force Q4 to turn on as described above and cause shoot-through.

In modern circuit designs, a designer typically controls the problem by using a large gate-source capacitance Cgs or a low Crss/Ciss ratio where the input capacitance Ciss and feedback capacitance Crss are determinate by the follows:

$Ciss = Cgd + Cgs$ $Crss = Cgd$

Alternately, the problem may also be prevented by providing a low gate resistance and using a high current gate drive with low Rext. However, if the gate drive circuitry, i.e., the control circuit 45, is remote from the MOSFET, the inductance Lg may become quite large. This causes the current path connected with Rg, Rext, and Lg to have great impedance thus leaving only the Cgs path to sink the transient current. The only way to suppress the shoot through current is by increasing the capacitance Cgs to reduce the impedance. However, this solution will lead to excessive gate charge losses in the low side MOSFET 20. For the above reasons, a person of ordinary skill of the art is faced with limitations and difficulties in designing a converter to effectively prevent the shoot through problem.

FIG. 5A shows a typical conventional trench MOSFET. As illustrated in this trench MOSFET cell, the gate-drain capacitance, i.e., Cgd, is a combination of a series the oxide capacitance, i.e., Cox and the depletion layer capacitance, i.e., Cdep. A functional relationship can be expressed as:

$Cgd = Cox*Cdep/(Cox+Cdep)$

As shown in FIG. 5B, the gate-drain capacitance Cgd decreases rapidly with the drain to source bias voltage, i.e., Vds bias, due to the decrease in depletion capacitance, i.e., Cdep, with the increase in depletion width under high bias. When the drain to source bias Vds is small, the oxide capacitance Cox dominatingly determines the value of the capacitance Cdg. And, since this capacitance Cox can be quite high and therefore can likely contribute to the shoot through current. In order to resolve these problems, different cell configurations were available to reduce the oxide capacitance Cox. FIG. 6A shows a prior art trench MOSFET with a thick bottom oxide that helps to reduce the capacitance from gate to drain Cgd. This cell configuration further provides additional benefits of reducing the capacitance across the entire range of Vds voltages. FIG. 6B shows another conventional solution where a second electrode is inserted below the gate electrode and tied to source potential. This electrode shields the gate from the drain thus reducing the gate to drain capacitance Cdg. However, both of these configurations add significant complexity to the fabrication processes. Furthermore, additional complication arises due to the facts that control of the recessed electrode and oxide is quite difficult.

Therefore, a need still exists in the art to provide an improved device configuration and manufacturing methods to make MOSFET devices with a work-function of the gate to shift the capacitance-voltage (C-V) functional characteristic to prevent the occurrences of shoot-through and resolve the above discussed difficulties as now encountered in the prior art.

SUMMARY OF THE PRESENT INVENTION

It is therefore an object of the present invention to provide an improved MOSFET device by adjusting the work function of a gate material thus increasing the threshold and shifting the capacitance-voltage (C-V) characteristic. The shoot through problem is resolved because a higher voltage is required to turn on the gate. The technical difficulties and limitations are therefore resolved by the shifted C-Vds operating characteristics.

Specifically, it is an object of the present invention to provide an improved MOSFET device with a higher gate work function by implementing a P-doped gate in an N-MOSFET device. The P-type gate increases the threshold voltage and shifts the C-Vds characteristics. The reduced Cgd thus achieves the purpose of suppressing the shoot through and resolve the difficulties discussed above. Unlike the conventional techniques as shown in FIGS. 5 and 6, the reduction of the capacitance Cgd is achieved without requiring complicated fabrication processes and control of the recess electrode.

Briefly in a preferred embodiment this invention discloses a metal oxide semiconductor field effect transistor (MOSFET) device. The MOSFET device further includes a trenched gate filled with a material for adjusting a gate work function to increase an absolute value of threshold and to lower a gate drain capacitance Cgd. In a preferred embodiment, the MOSFET device includes a trenched gate filled with a gate material having a work function higher than an N+ poly for a n-channel MOSFET and lower than a P+ poly for a P-channel MOSFET. In another preferred embodiment, the MOSFET is a N-channel MOSFET and the trenched gate is filled with a P-doped gate material. In another preferred embodiment, the MOSFET is a P-channel MOSFET and the trenched gate is filled with a N-doped gate material. In another preferred embodiment, the MOSFET comprising a channel of a first conductivity type and the trenched gate is filled with a second conductivity gate material. In another preferred embodiment, the trenched gate material further reducing a Vgs spike in response to an dVds/dT by adjusting the work function wherein the Vgs representing a gate-drain voltage and the dVds/dT representing a rate of change of a drain-to-source voltage over time. In another preferred embodiment, the trenched gate material further shifting a C-V characteristic curve representing a gate-to-drain capacitance (Cgd) as a function of drain-to-source voltage (Vds) for reducing the Cgd by adjusting the work function. In another preferred embodiment, the gate material further includes a p-type polysilicon having a dopant concentration up to $10^{22}/cm^3$ to substantially reduce gate resistance. In another preferred embodiment, the gate material trench further comprises a polycide for further improvement of gate resistance. In another preferred embodiment, the gate material comprising a tungsten gate material. In another preferred embodiment, the gate material comprising a platinum silicide gate material.

In another preferred embodiment the MOSFET device further includes a trenched gate filled with a material with gradient dopant concentration.

This invention further discloses a method for manufacturing a power MOSFET device by filling a trenched gate with a gate material having a work function to increase an absolute value of threshold and to lower a gate drain capacitance Cgd. In a preferred embodiment, the method further includes a step of filling a trenched gate with a gate material having a work function higher than an N+ poly for a n-channel MOSFET and lower than a P+ poly for a P-channel MOSFET.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 8B is a C-V diagram for showing the shift of C-V operational characteristics with a p-type gate shown in FIG. 7.

FIGS. 8C and 8D are diagrams for illustrating the time variations of Vds and Vgs.

DETAILED DESCRIPTION OF THE METHOD

Figure 1:
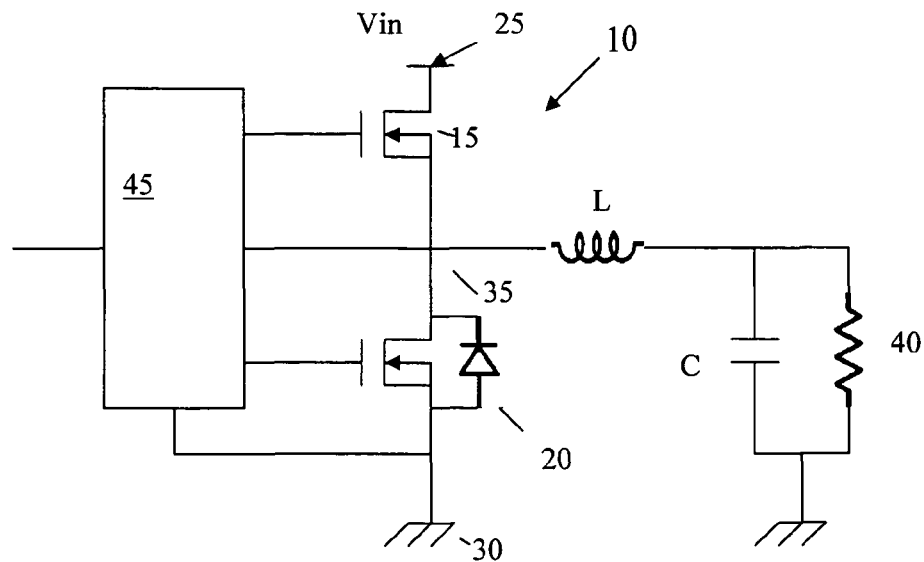
FIG. 1 is a circuit diagram of a conventional buck converter.
Figure 2:
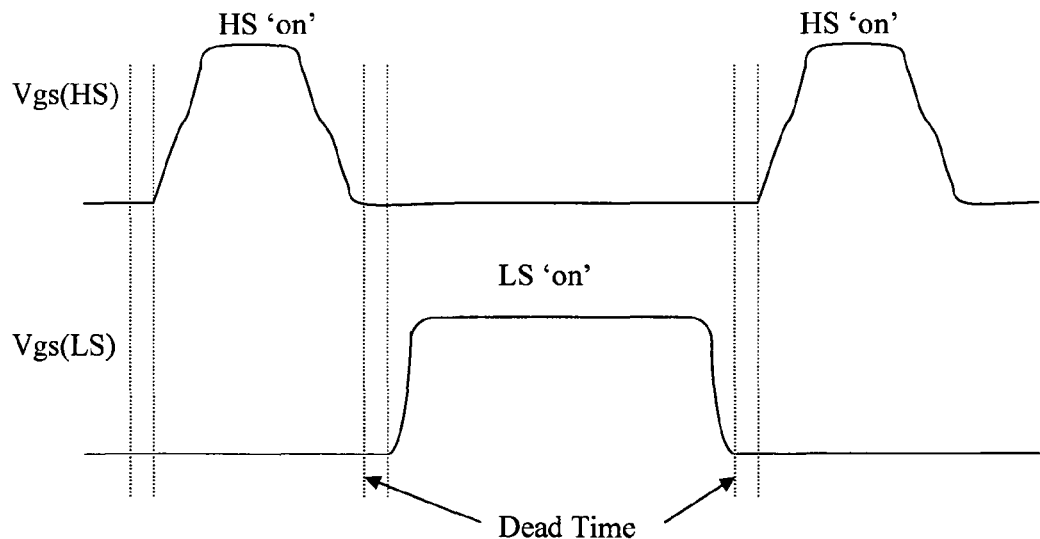
FIG. 2 shows the waveforms of gate voltages for the high side and low side MOSFET of FIG. 1.
Figure 3:
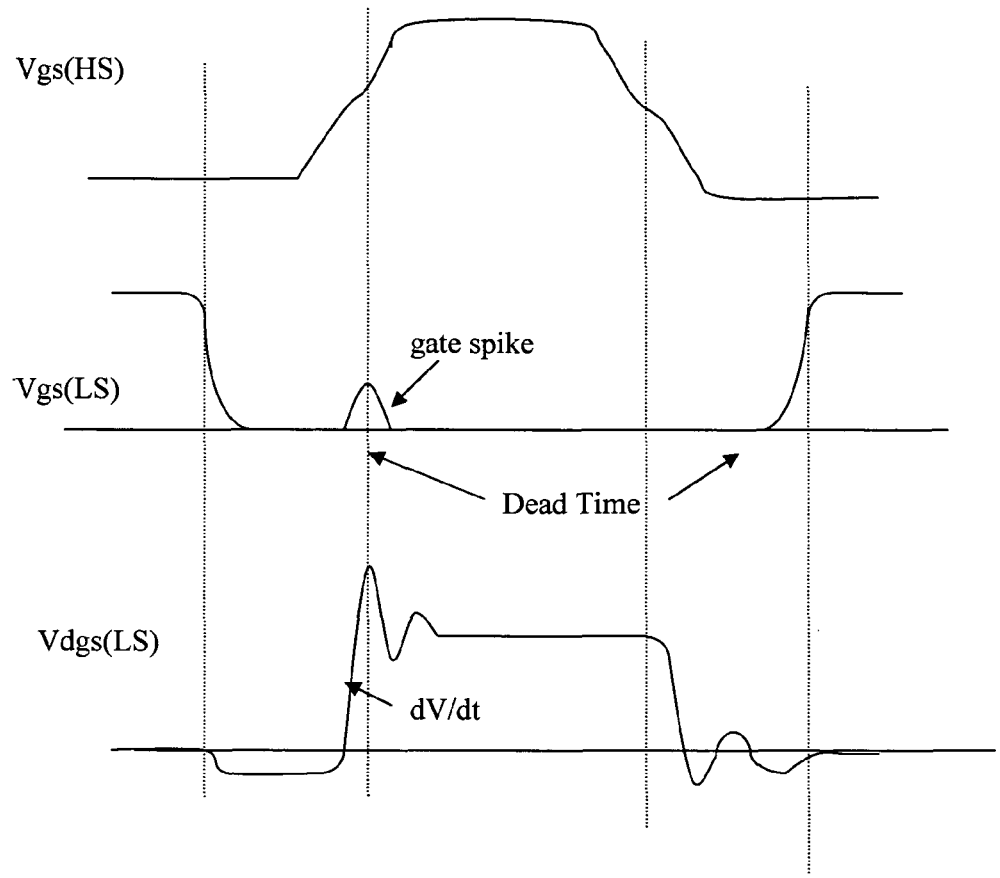
FIG. 3 shows the gate spike and drain to source voltage Vds of the low side MOSFET resulting from a high rate of change of the drain (Vds) voltage of high side MOSFET.
Figure 4A:
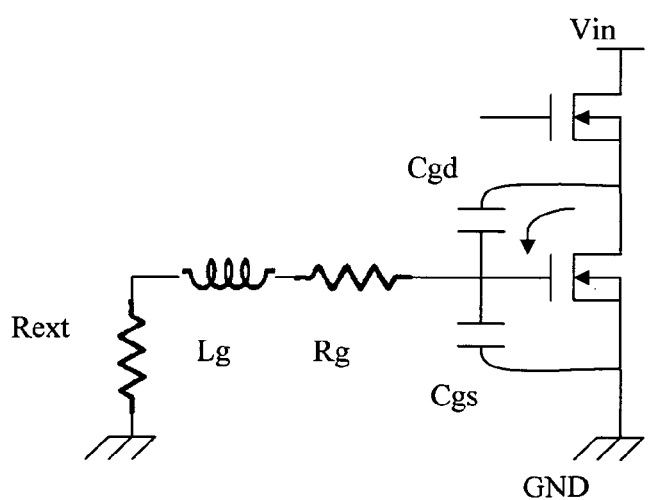
FIG. 4A shows a conventional circuit in attempt to resolve the shoot through problem as that shown in FIG. 3.
Figure 4B:
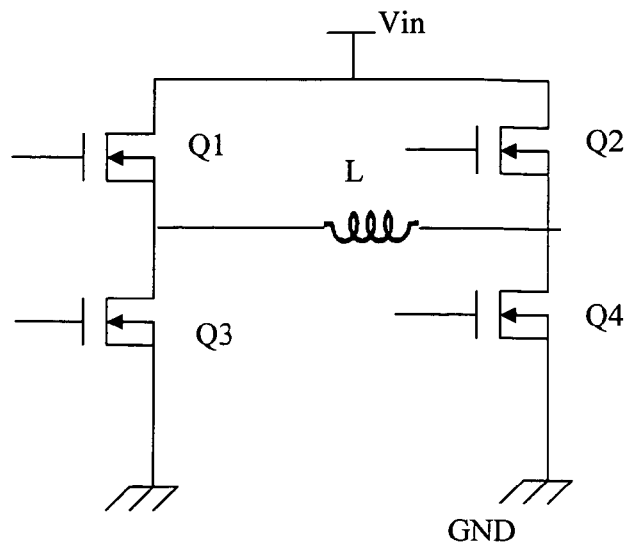
FIG. 4B is a circuit diagram of a conventional bridge inverter.
Figure 5A:
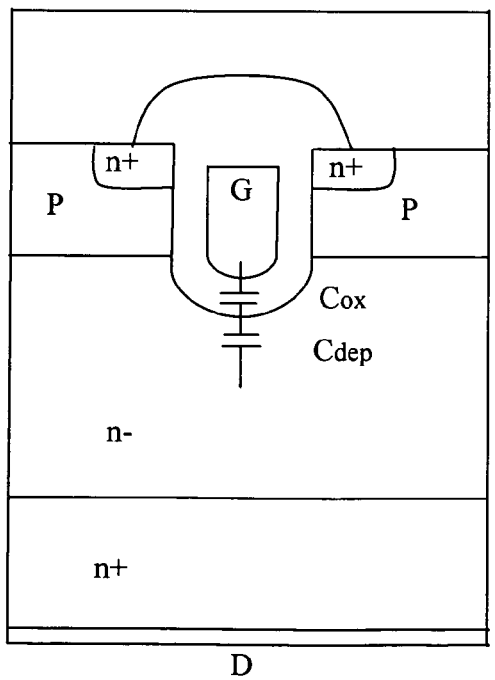
FIG. 5A shows a typical conventional trench MOSFET.
Figure 5B:
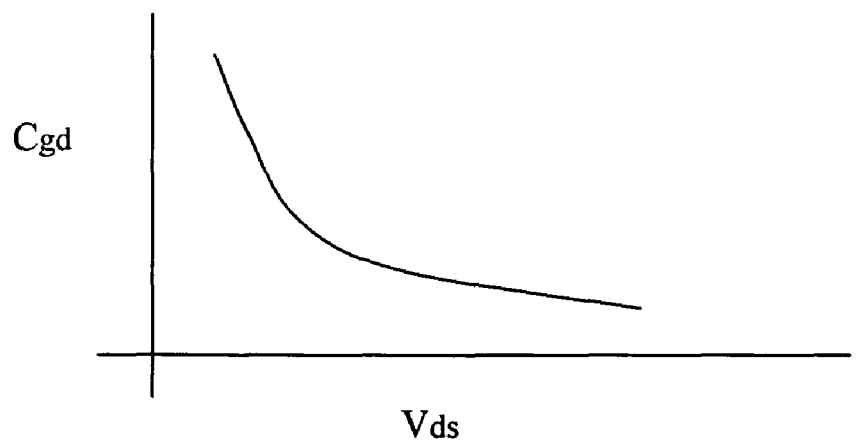
FIG. 5B is a diagram showing the gate-drain capacitance Cgd as a function of the drain to source bias voltage, i.e., Vds bias, due to the decrease in depletion capacitance, i.e., Cdep.
Figure 6A:
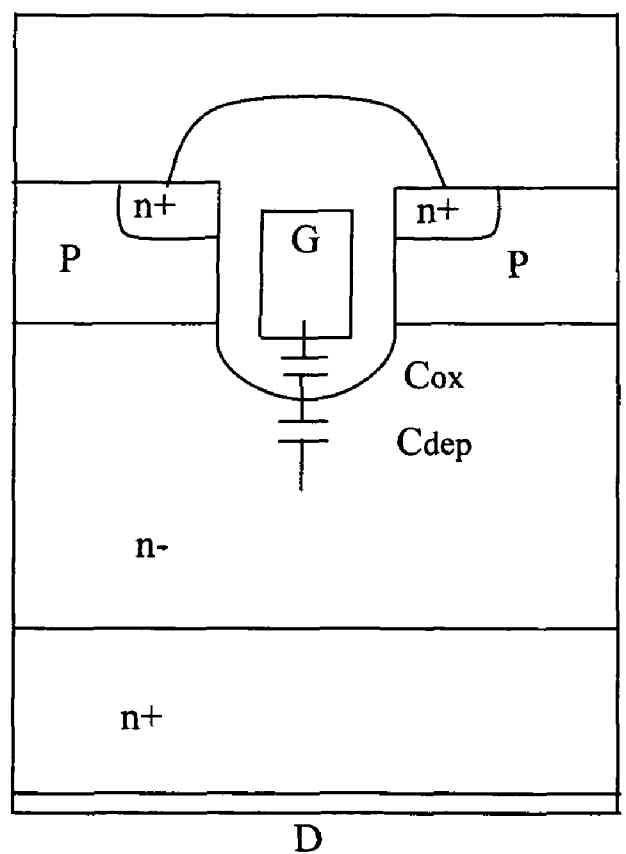
FIG. 6A shows a prior art trench MOSFET with a thick bottom oxide that helps to reduce the capacitance from gate to drain Cgd.
Figure 6B:
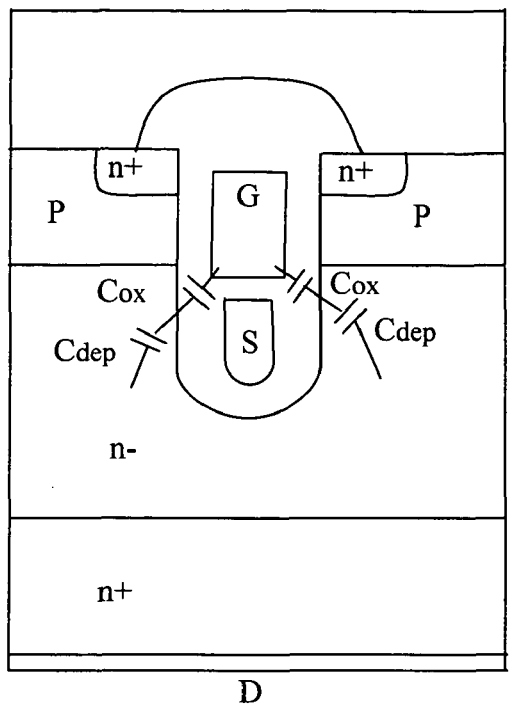
FIG. 6B shows another conventional solution where a second electrode is inserted below the gate electrode and tied to source potential.
Figure 7A:
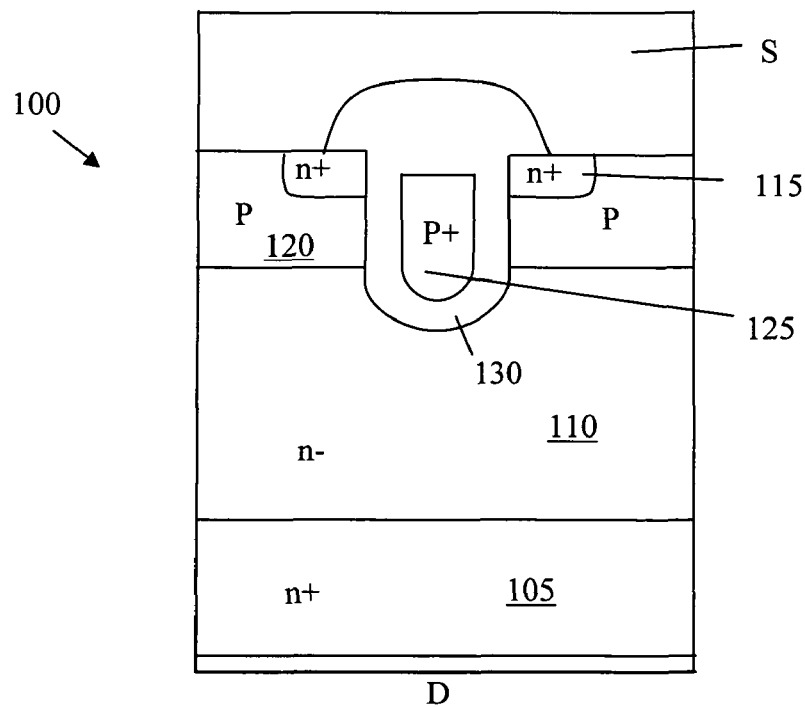
FIG. 7A is a side cross sectional view of a MOSFET device of this invention with a p-type gate material to increase the work function.

Referring to FIG. 7A for a side cross sectional view of a new n-channel MOSFET cell 100 of this invention. The MOSFET 100 is formed on an N+ substrate 105 functioning as a drain. The N+ substrate supporting an N– epi-layer 110 thereon to form a vertical pn-junction region with an N+ source region 115 formed on top of a deeper p-body region 120. The MOSFET 100 further includes a gate 125 formed with polysilicon layer deposited in a trench formed in the epi-layer 110 with a gate oxide layer 130 insulating the gate 125 inside the trench. A current path is established from the source 115 via a channel formed in the p-body 120 along the gate 125 and extends to the drain in the N+ substrate 105. In this new MOSFET cell 100, the work function of the gate is changed to create a shift in the C-V characteristic. To achieve the change of the work function of the gate 125, the gate 125 is doped with a p-type dopant to form a p-type gate.

With a p-type gate as shown in FIG. 7A, the threshold voltage, i.e., Vth, is increased by an amount of 1.1 volts. This increase in the threshold voltage is correspondent to a band-gap of the silicon. A higher threshold voltage is beneficial in suppressing the shoot through because it requires a higher spike to turn on the gate. Normally an N channel MOS uses N type doped poly gate and a P channel MOS uses P type doped poly gate to achieve low threshold and low gate resistance. The normal work function for NMOS is usually around 4.05 ev and for PMOS is about 5.15 ev.

Table 1 shows a comparison of the values of the capacitance at 0 volt and 15 volts with an N-type gate and a P-type silicon gate for a 30 volts MOSFET device.

TABLE 1

| | Ciss (0 V) | Coss (0 V) | Crss (0 V) | Ciss (15 V) | Coss (15 V) | Crss (15 V) | Vt | Rds (4.5) |
|---|---|---|---|---|---|---|---|---|
| P-gate N channel | 9.2 nf | 2.19 nf | 1.09 nf | 7.7 nf | 625 pf | 395 pf | 2.26 V | 2.95 mohm |
| N-gate N channel | 8.86 nf | 4.18 nf | 3.1 nf | 6.1 nf | 636 pf | 420 pf | 1.18 V | 2.6 mohm |

Figure 7B:
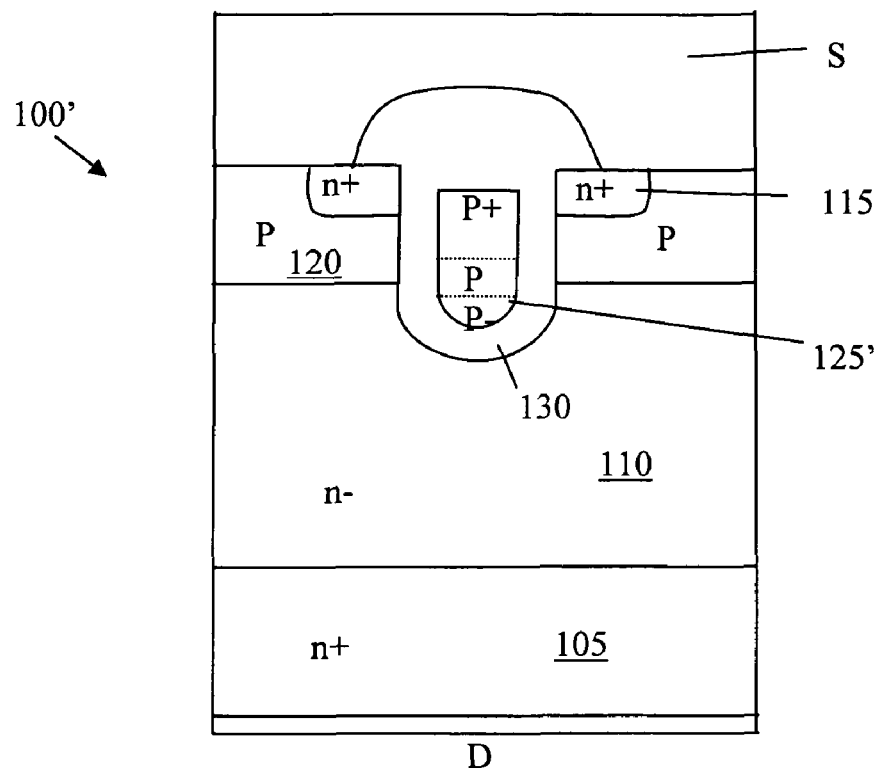
FIG. 7B is a side cross sectional view of a MOSFET device of this invention with a gradient doped p-typed material to increase the work function.

Referring to FIG. 7B for a side cross sectional view of another new MOSFET cell 100' of this invention. The MOSFET 100' is essentially the same as MOSFET 100 except that gate 125' has a gradient distribution of P dopant concentration. The gate has high P+ dopant concentration in top portion, medium P dopant concentration in the middle portion and light P− dopant concentration in the bottom. A gradient distribution of concentration provides extra benefit to reduce Crss at higher operation voltage as shown below and an extra parameter for the designer to optimize the device.

Figure 8A:
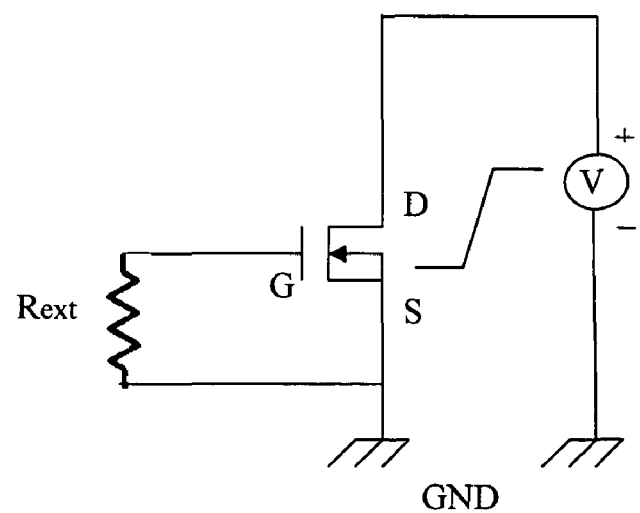
FIG. 8A is an equivalent circuit of the MOSFET device of FIGS. 7A and 7B.

An equivalent circuit of the MOSFET device of FIGS. 7A and B is shown in FIG. 8A. As discussed above, a shift of 1.1 volts in the Cgd-Vds characteristics, i.e., the functional relationship between the capacitance and Vds, does reduce the Crss at 0 volt as that shown in FIG. 8B. Furthermore the gradient distribution of gate dopant further reduces the Crss at higher voltage. FIGS. 8C and 8D show a reduced Vgs spike in response to an applied dVdS/dT for the P+ gate device. Coupled with the higher Vt, the MOSFET device as disclosed in this invention has a significantly increased likelihood that the device is immune from shoot-thru problem.

For practical implementation, in order to keep the on-state resistance low, a thin gate oxide layer 130 is formed. A thin oxide layer 130 also has a benefit of preserving a higher Ciss and that further leads to a smaller Crss/Ciss ratio. The concern of raising gate resistance of implementing a p-type gate can be circumvented by increased polysilicon doping or applying a gate polycide formation.

The new and improved device by adjusting the work function of the gate material to raise the threshold voltage and shift the Cgd-Vds characteristics may be achieved by other techniques as well. For example, instead of p-type gate material, a tungsten or platinum silicide gate may be employed to increase the work function of the gate material. For a person of ordinary skill in the art, any materials, alloys or doped impurities that can be applied to adjust the gate material work function higher than n+ poly may be selected and employed to n-channel and any materials, alloys or doped impurities that can be applied to reduce the gate material work function lower than p+ poly may be selected and employed to p-channel to achieve the benefits as discussed above.

Figure 9A:
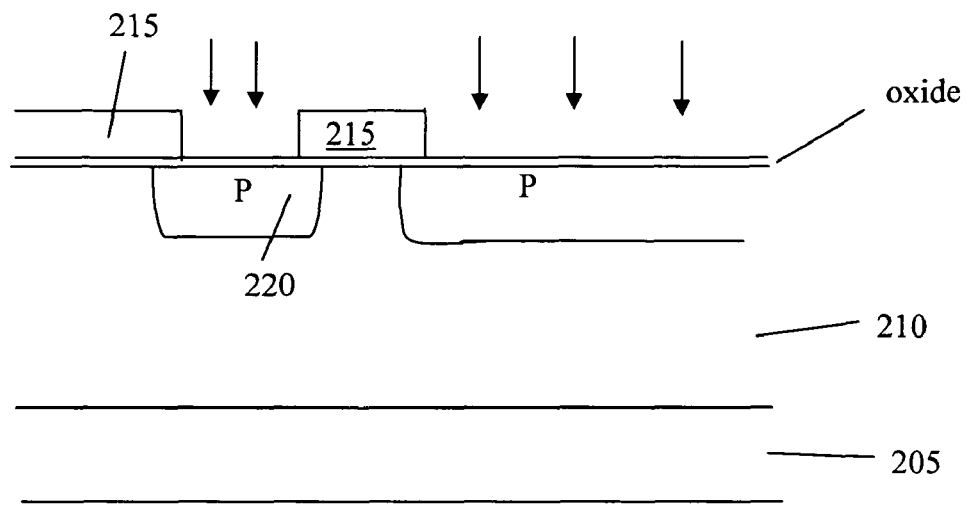
FIGS. 9A to 9E are serial of side cross sectional views for illustrating the processing steps for manufacturing the MOSFET device of FIG. 7.
Figure 9B:
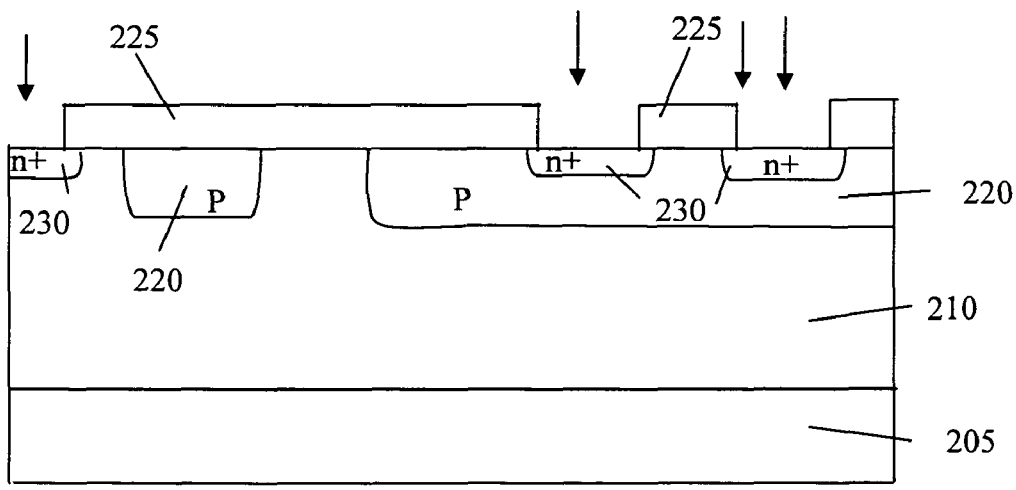
Figure 9C:
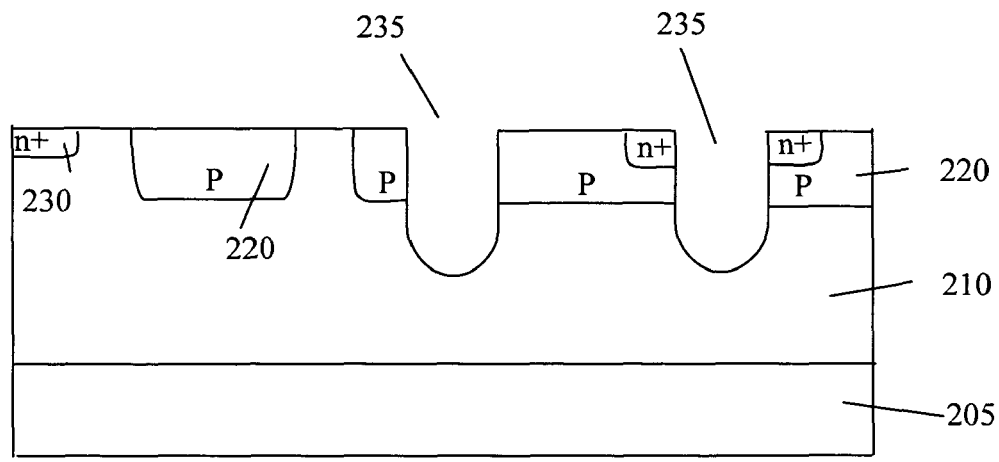
Figure 9D:
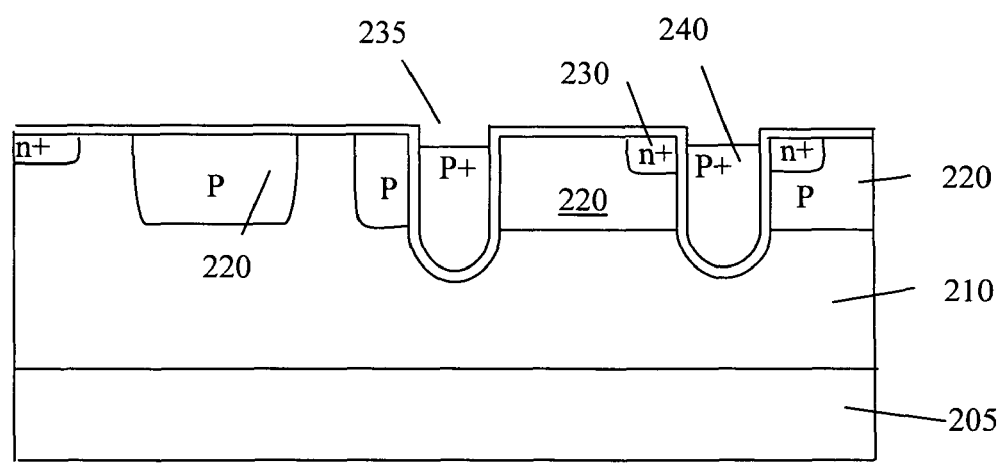
Figure 9E:
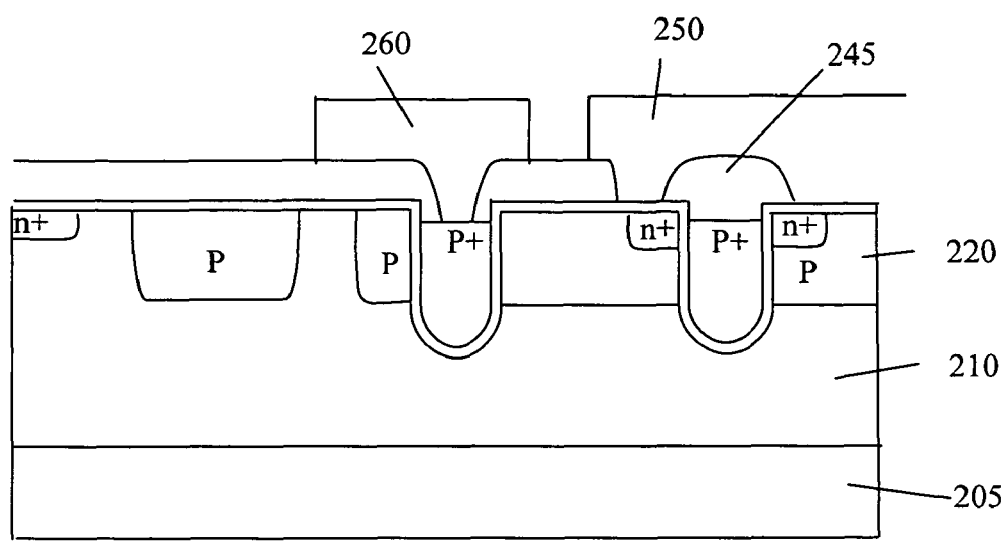

FIGS. 9A to 9E are a serial of side cross sectional views for illustrating the processing steps of a "gate-last" method for fabricating a MOSFET device of FIGS. 7A and 7B. In FIG. 9A, a first mask, i.e., the photo resist 215, and screen oxide (not shown) are used to carry out a body implant with a P-type ion dopant to form a plurality of P-body regions 220 in an N-epitaxial layer 210 supported on a N+ substrate 205. A diffusion process is then carried out to develop the P-body regions 220 in the epitaxial layer 210. In FIG. 9B, a second mask, i.e., the source mask 225, is applied to carry out a source implant with N+ ion dopant followed by a diffusion process to form the N+ source regions 230. In FIG. 9C, a third mask, i.e., the trench mask, is applied to etch and open a plurality of trenches 235 that vertically extends beyond the bottom level of the P-body region 220. Further processes are carried out for rounding the trench, sacrificial oxide removal, gate oxide layer formation, polysilicon deposition into the trenches 235 to form the gate 240 and polysilicon doping process to make the P-type polysilicon gate 240 as discussed above. An uniformly doped gate may be achieved by using in-situ ion implant. To achieve gradient distribution of gate dopant concentration, a precisely controlled ion implantation followed by a fast diffusion may be performed before or after an etch-back process to leave poly only in the trenches. In FIG. 9E, an insulating BPSG layer 245 is deposited followed by applying the fourth mask, i.e., the contact mask to etch a plurality contact openings followed by an implant operation to improve the body contact resistance. Then a metal layer is deposited and a fifth mask, i.e., a metal mask is applied to etch and pattern the metal layer into the source metal 250 and the gate metal 260. A resist mask used for implant only leaves no impression for future layers alignment. To overcome this difficulty, a special mask, e.g., generally referred to as $0^{th}$ mask, is used to etch alignment targets. Aligning each separately to the patterns on the $0^{th}$ can align the body and source and the trench masks relative to each other.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, a P channel device can suppress the shoot through by adopting a N doped gate. Accordingly, it is intended that the appended claims be interpreted as covering all alterations and modifications as fall within the true spirit and scope of the invention.

We claim:

1. A method for manufacturing a metal oxide semiconductor field effect transistor (MOSFET) device comprising:
    filling a trenched gate with a gate material and doping the gate material with a dopant with a gradually decreasing dopant concentration along a vertically downward direction extending to a drain region of said MOSFET device to adjust a work function for increasing a threshold voltage and creating a shift C-V characteristic of said MOSFET device from a MOSFET with an uniformly doped gate material.

2. The method of claim 1 wherein:
    said step of filling said trenching gate comprising a step of filling said trenched gate with a P-doped gate material for an N-channel MOSFET and doping said P-doped gate material to have said gradually decreasing dopant concentration along the vertically downward a direction for increasing said threshold voltage of said N-channel MOSFET.

3. The method of claim 1 wherein:
said step of filling said trenching gate comprising a step of filling said trenched gate with a N-doped gate material for a P-channel MOSFET and doping said N-doped gate material to have said gradually decreasing dopant concentration along the vertically downward a direction for increasing said threshold voltage of said P-channel MOSFET.

4. The method of claim 1 wherein:
said step of filling said trenching gate comprising a step of filling said trenched gate with a uniform single-deposition gate material of a first conductivity type gate material for a second conductivity type MOSFET and doping said first conductivity type gate material to have said gradually decreasing dopant concentration along the vertically downward direction for increasing said threshold voltage of said MOSFET.

5. The method of claim 1 wherein:
said step of doping said gate material to have said gradually decreasing dopant concentration along the vertically downward direction further includes a step of doping the gate material to reduce a Vgs spike in response to an dVds/dT by adjusting said work function wherein said Vgs representing a gate-drain voltage and said dVds/dT representing a rate of change of a drain-to-source voltage over time.

6. The method of claim 1 wherein:
said step of doping said gate material to have said gradually decreasing dopant concentration along the vertically downward direction further includes a step of doping the gate material to shift a C-V characteristic curve representing a gate-to-drain capacitance (Cgd) as a function of drain-to-source voltage (Vds) for reducing said Cgd by adjusting said work function.

7. The method of claim 1 wherein:
said step of doping said gate material having said gradually decreasing dopant concentration along the vertically downward direction further includes a step of doping the gate material with a P-type body dopant with a P+ dopant concentration near a top portion of said trenched gate, a P dopant concentration in a middle portion of said trenched gate and a P− dopant concentration near a bottom portion of said trenched gate.

8. The method of claim 1 wherein:
said step of doping said trenched gate material further comprises a step of doping said trench gate material of a N-channel MOSFET with a P-type polycide.

9. The method of claim 1 wherein:
said step of filling said trenching gate comprising a step of filling said trenched gate with an uniform single-deposition trench gate material composed of a tungsten gate material having a second conductivity type opposite from a first conductivity type of a channel of the MOSFET device.

10. The method of claim 1 wherein:
said step of filling said trenching gate comprising a step of filling said trenched gate with an uniform single-deposition trench gate material composed of a silicide gate material having a second conductivity type opposite from a first conductivity type of a channel of the MOSFET device.

11. The method of claim 1 wherein:
said step of filling said trenching gate comprising a step of filling said trenched gate with a an uniform single-deposition gate material composed of a platinum silicide gate material with a second conductivity type opposite from a first conductivity type of a channel of the MOSFET.

12. The method of claim 1 wherein:
said step of doping said gate material having said gradually decreasing dopant concentration along the vertically downward direction further includes a step of doping the gate material of a N-channel MOSFET device with a P-type polysilicon having a dopant concentration up to 1022/cm3 with gradually decreasing dopant concentration along said vertically downward direction of said trenched gate.

\* \* \* \* \*